United States Patent
Jung et al.

(10) Patent No.: US 11,416,032 B2
(45) Date of Patent: Aug. 16, 2022

(54) FLEXIBLE DISPLAY APPARATUS

(71) Applicant: SAMSUNG DISPLAY CO., LTD., Yongin-si (KR)

(72) Inventors: Tae-Hyeog Jung, Yongin-si (KR); Sang-Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/529,492

(22) Filed: Aug. 1, 2019

(65) Prior Publication Data

US 2019/0354141 A1 Nov. 21, 2019

Related U.S. Application Data

(60) Continuation of application No. 16/105,941, filed on Aug. 20, 2018, now Pat. No. 10,401,909, which is a
(Continued)

(30) Foreign Application Priority Data

May 28, 2013 (KR) .................. 10-2013-0060219

(51) Int. Cl.
*G06F 1/16* (2006.01)
*G02F 1/1333* (2006.01)
*H01L 51/52* (2006.01)

(52) U.S. Cl.
CPC ...... *G06F 1/1652* (2013.01); *G02F 1/133305* (2013.01); *G09G 2380/02* (2013.01); *H01L 51/5237* (2013.01); *H01L 2251/5338* (2013.01)

(58) Field of Classification Search
CPC ............ G06F 1/1652; G02F 1/133305; G09G 2380/02; H01L 2251/5338; H01L 51/5237
See application file for complete search history.

(56) References Cited

U.S. PATENT DOCUMENTS 6,107,988 A 8/2000 Phillipps
6,377,324 B1 * 4/2002 Katsura ................ G06F 1/1643
349/58
(Continued)

FOREIGN PATENT DOCUMENTS

| CN | 102831828 | 12/2012 |
| KR | 10-2010-0082451 | 7/2010 |
| KR | 10-2012-0063748 | 6/2012 |

OTHER PUBLICATIONS

Office Action dated Aug. 1, 2017 in corresponding Chinese Patent Application No. 20140092501.7.

*Primary Examiner* — Rockshana D Chowdhury
*Assistant Examiner* — Douglas R Burtner
(74) *Attorney, Agent, or Firm* — Lewis Roca Rothgerber Christie LLP

(57) ABSTRACT

A flexible display apparatus includes a display panel, a case and a plurality of driving circuits. The display panel is configured to display an image. The display panel includes a first display part, a second display part and a hinge display part. The hinge display part is interposed between the first and second display parts. The hinge display part is configured to be foldable. The case is configured to cover the display panel. The case forms a hinge thickness with the hinge display part and it also forms a peripheral thickness at an end of the case facing away from the hinge display part. The peripheral thickness is greater than the hinge thickness. The driving circuits are disposed between a rear surface of the first display part and the case. Therefore, thickness of the display panel is decreased and its portability is improved.

5 Claims, 7 Drawing Sheets

Related U.S. Application Data continuation of application No. 15/700,593, filed on Sep. 11, 2017, now Pat. No. 10,054,989, which is a division of application No. 14/064,481, filed on Oct. 28, 2013, now Pat. No. 9,791,891.

(56) References Cited

U.S. PATENT DOCUMENTS

| | | | | |
|---|---|---|---|---|
| 6,577,496 | B1* | 6/2003 | Gioscia | H04M 1/0216 455/344 |
| 7,714,801 | B2* | 5/2010 | Kimmel | G06F 1/1677 345/1.3 |
| 8,908,365 | B2* | 12/2014 | Walters | G06F 1/1641 312/319.2 |
| 9,084,338 | B2 | 7/2015 | Gu et al. | |
| 9,235,239 | B2* | 1/2016 | van Dijk | H04M 1/0268 |
| 10,444,797 | B2* | 10/2019 | Kee | G06F 1/1652 |
| 2002/0071082 | A1 | 6/2002 | Okita et al. | |
| 2003/0043095 | A1* | 3/2003 | Silverbrook | G06Q 50/00 345/87 |
| 2004/0124765 | A1* | 7/2004 | Iwase | G06F 1/1692 313/504 |
| 2006/0050169 | A1* | 3/2006 | Misawa | G06F 1/1698 348/333.06 |
| 2006/0146488 | A1* | 7/2006 | Kimmel | G09F 9/301 361/679.04 |
| 2007/0146243 | A1* | 6/2007 | Ou Yang | G06F 1/1601 345/76 |
| 2008/0300031 | A1* | 12/2008 | Cho | H04M 1/0216 455/575.3 |
| 2009/0061930 | A1 | 3/2009 | Gioscia et al. | |
| 2010/0182265 | A1 | 7/2010 | Kim et al. | |
| 2010/0277443 | A1* | 11/2010 | Yamazaki | G06F 1/1643 345/204 |
| 2011/0102976 | A1* | 5/2011 | Chen | G06F 1/1616 361/679.01 |
| 2012/0008267 | A1 | 1/2012 | Watanabe | |
| 2012/0044620 | A1* | 2/2012 | Song | H04M 1/0216 361/679.01 |
| 2012/0056859 | A1* | 3/2012 | Chen | G09G 3/20 445/24 |
| 2012/0111954 | A1 | 5/2012 | Kim et al. | |
| 2012/0147599 | A1 | 6/2012 | Shim et al. | |
| 2012/0162876 | A1* | 6/2012 | Kim | G06F 1/1652 361/679.01 |
| 2012/0262870 | A1 | 10/2012 | Leung | |
| 2013/0010405 | A1* | 1/2013 | Rothkopf | G06F 1/1652 361/679.01 |
| 2013/0021762 | A1* | 1/2013 | van Dijk | H04M 1/022 361/749 |
| 2013/0037228 | A1* | 2/2013 | Verschoor | G06F 1/1652 160/377 |
| 2013/0120912 | A1* | 5/2013 | Ladouceur | G06F 1/1616 361/679.01 |
| 2013/0222998 | A1* | 8/2013 | Cho | G06F 1/1601 361/679.27 |
| 2013/0342094 | A1* | 12/2013 | Walters | G06F 1/1652 312/319.2 |
| 2014/0042293 | A1* | 2/2014 | Mok | H04M 1/0216 248/682 |
| 2014/0111954 | A1* | 4/2014 | Lee | H05K 1/028 361/749 |
| 2014/0123436 | A1* | 5/2014 | Griffin | G06F 1/1681 16/221 |
| 2014/0126121 | A1* | 5/2014 | Griffin | H04M 1/0216 361/679.01 |
| 2014/0126133 | A1* | 5/2014 | Griffin | G06F 1/1652 312/326 |
| 2014/0307395 | A1* | 10/2014 | An | H01L 27/3244 361/749 |
| 2014/0328041 | A1* | 11/2014 | Rothkopf | H05K 5/0017 361/807 |
| 2015/0077917 | A1* | 3/2015 | Song | G06F 1/1652 361/679.27 |
| 2015/0277496 | A1* | 10/2015 | Reeves | G09F 9/301 345/1.2 |
| 2016/0155965 | A1* | 6/2016 | Kusuura | G06F 1/1652 29/829 |
| 2017/0160769 | A1* | 6/2017 | Xu | G06F 1/1652 |
| 2018/0024593 | A1* | 1/2018 | Seo | H04M 1/0268 361/679.21 |
| 2019/0391615 | A1* | 12/2019 | Kee | H04M 1/0268 |
| 2022/0019265 | A1* | 1/2022 | Kee | G06F 1/1652 |

* cited by examiner

FLEXIBLE DISPLAY APPARATUS

CROSS-REFERENCE TO RELATED APPLICATION

This application is a continuation of U.S. patent application Ser. No. 16/105,941, filed Aug. 20, 2018, which is a continuation of U.S. patent application Ser. No. 15/700,593, filed Sep. 11, 2017, now U.S. Pat. No. 10,054,989, which is a divisional of U.S. patent application Ser. No. 14/064,481, filed Oct. 28, 2013, now U.S. Pat. No. 9,791,891, which claims priority to and the benefit of Korean Patent Application No. 10-2013-0060219, filed May 28, 2013, the entire content of all of which is incorporated herein by reference.

BACKGROUND

Field

Embodiments of the inventive concept relate generally to a flexible display apparatus having reduced thickness and improved portability.

Description of the Related Technology

A flat panel display apparatus has various characteristics such as thin thickness, small size, light weight, low power consumption, etc. Thus, the flat panel display apparatus has been widely used in various fields.

In order to improve portability of the flat panel display apparatus, a foldable display apparatus has been devised. The foldable display apparatus has two corresponding panels connected to each other to be folded. However, an image displayed on the two corresponding panels has discontinuity along a boundary between the two corresponding panels. Thus, image display quality is deteriorated.

SUMMARY OF CERTAIN INVENTIVE ASPECTS

Some example embodiments disclosed herein provide a flexible display apparatus having reduced thickness and improved portability.

According to some example embodiments, a flexible display apparatus includes a display panel, a case and a plurality of driving circuits. The display panel is configured to display an image. The display part includes a first display part, a second display part and a hinge display part. The hinge display part is interposed between the first and second display parts. The hinge display part is configured to be foldable. The case is configured to cover the display panel. The case forms a hinge thickness with the hinge display part and it also forms a peripheral thickness at an end of the case facing away from the hinge display part. The peripheral thickness is greater than the hinge thickness. The plurality of driving circuits are disposed between a rear surface of the first display part and the case.

The case may include a first cover, a second cover and a hinge cover. The first cover may be configured to cover the first display part. The second cover may be configured to cover the second display part. The hinge cover may be configured to cover the hinge cover.

A first element space may be defined by the rear surface of the first display part and the first cover. The driving circuits may be disposed in the first element space.

A second element space may be defined by a rear surface of the second display part and the second cover. The flexible display apparatus may further include a plurality of driving circuits disposed in the second element space.

The first display part may be inclined with respect to the first cover.

The second display part may be inclined with respect to the second cover.

The second display part may be substantially parallel with the second cover.

The first display part may be inclined with respect to the first cover.

The first display part may be recessed toward the first cover.

The hinge display part may include a first hinge portion, a second hinge portion and a third hinge portion. The first hinge portion may be adjacent to the first display part. The second hinge portion may be adjacent to the second display part. The third hinge portion may be interposed between the first and second hinge portions.

The case may include a first cover, a second cover and a third cover. The first cover may be configured to cover the first hinge portion and the first display part. The second cover may be configured to cover the second hinge portion and the second display part. The third cover may be configured to cover the third hinge portion.

The first display part may be substantially parallel with the first cover, and the second display part may be substantially parallel with the second cover.

The first and second hinge portions may be inclined with respect to the first and second covers, respectively, and the third hinge portion may have a substantially semi circular shape.

The case may include a first cover, a second cover and a third cover. The first cover may be configured to cover the first display part and a portion of the hinge display part adjacent to the first display part. The second cover may be configured to cover the second display part and a portion of the hinge display part adjacent to the second display part. The hinge cover may be configured to cover a central portion of the hinge display part.

The hinge display part may have a substantially cylindrical shape.

The first display part may have a convex shape protruded in a direction opposite to the first cover, and the second display part has a convex shape protruded in a direction opposite to the second cover.

An end of the first display part may be combined with a first end of the case, and an end of the second display part may be combined with a second end of the case.

The display panel may further include a first portion and a second portion. The first portion may be extended from the first display part to be combined with the first end of the case. The second portion may be extended from the second display part to be combined with the second end of the case.

The case may be stretched such that a tension is applied to the ends of the first and second display parts, so that the display panel is stretched to have a substantially flat shape.

A rear surface of the hinge display part may directly face the hinge cover.

During the wet etching, the line defect caused by over-etching is decreased and resistance at a portion of the line adjacent to the pad may not be increased. Thus, signal transmittance of the lines is increased, so that an image display quality of the display apparatus may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

Figure 1:
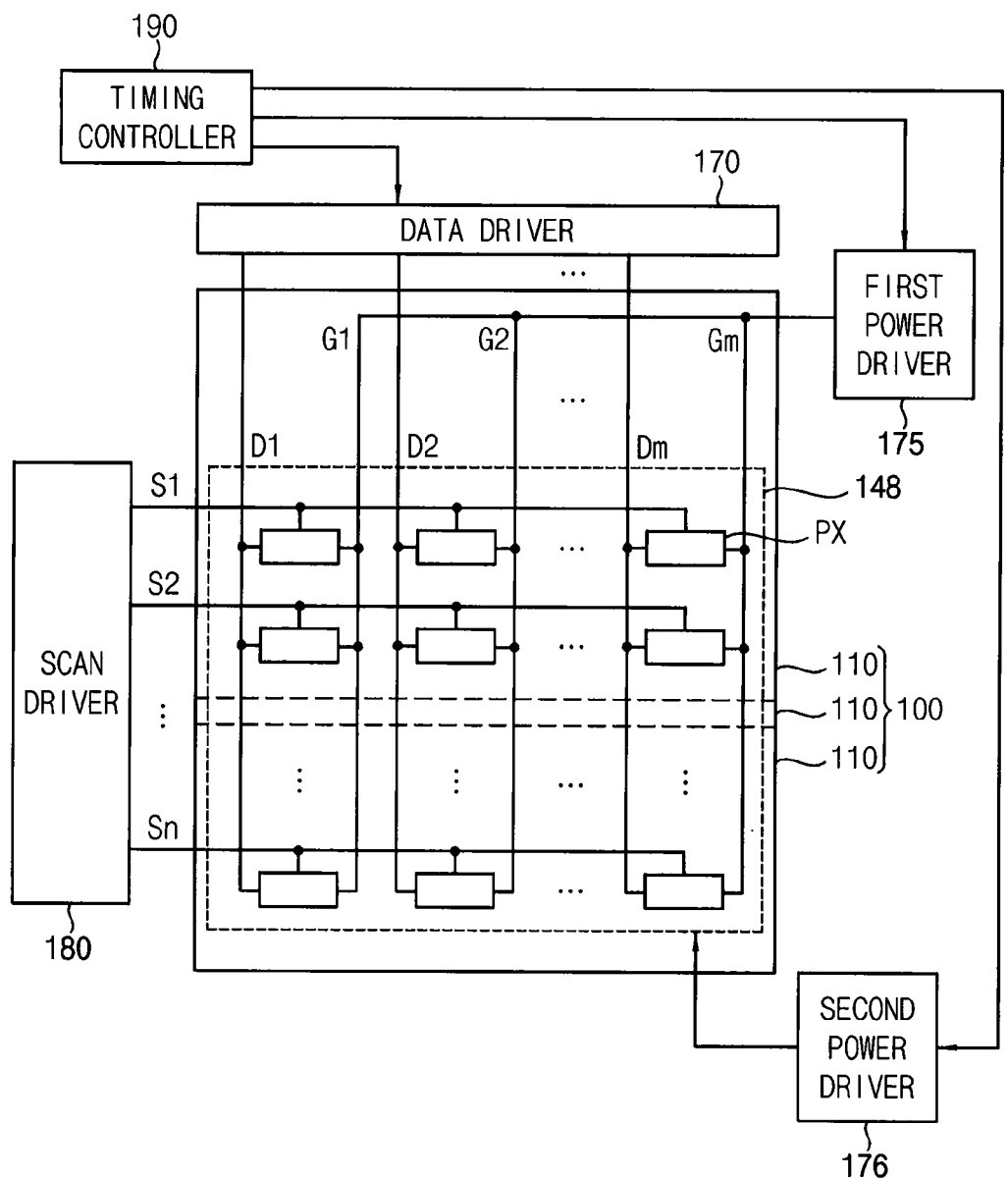
FIG. 1 is a plan view illustrating a flexible display apparatus according to one example embodiment of the present invention.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals generally refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Recently, a flexible display panel has been devised. The flexible display panel is resistant to an externally provided impact and has various shapes. However, the flexible display panel may not be completely folded so that an extra space is required between the folded flexible display panel, thereby increasing a thickness of the flexible display. Thus, portability of the foldable display apparatus having the flexible display panel may be decreased.

In addition, tension is applied to the folded portion of the foldable display apparatus having the flexible display panel. The folded portion receiving the tension is vulnerable to an externally provided impact, thereby being easily broken.

Figure 2:
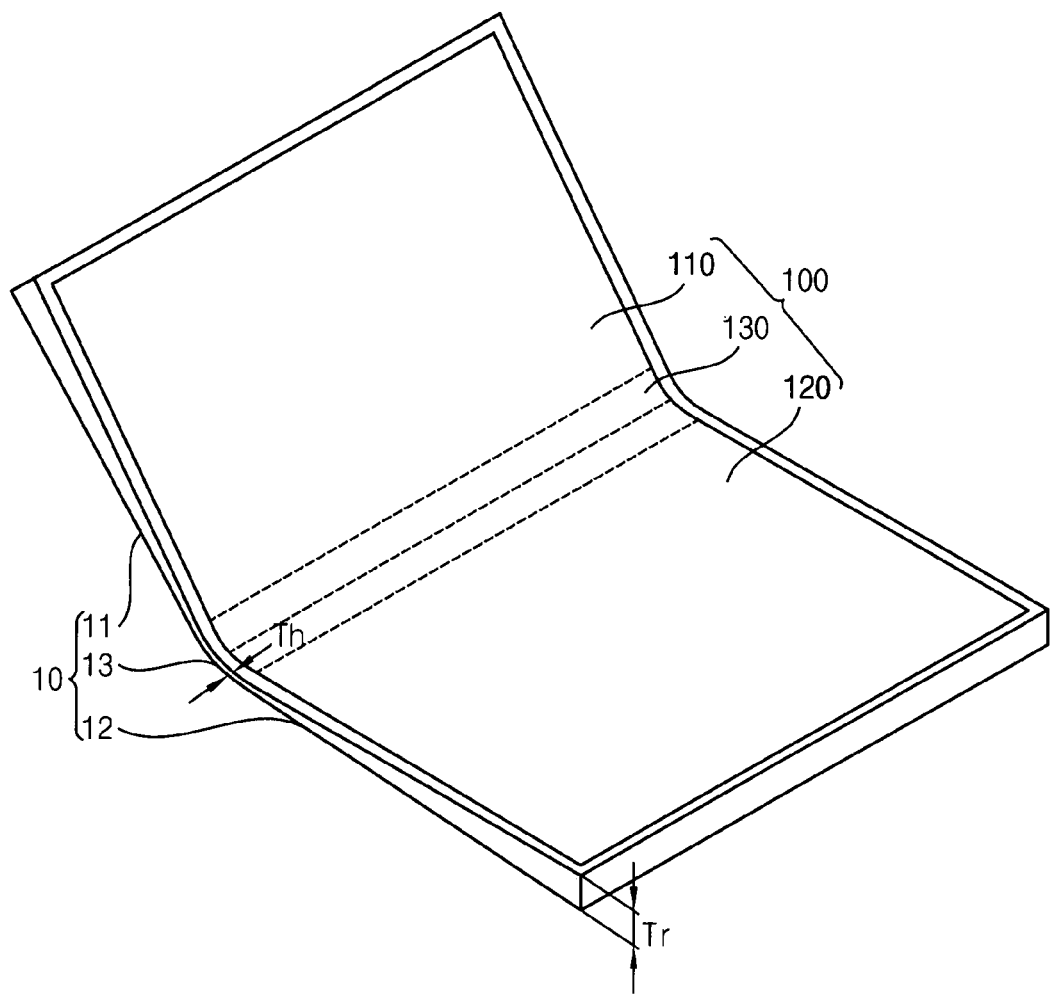
FIG. 2 is a perspective view illustrating the flexible display apparatus of FIG. 1.
Figure 3:
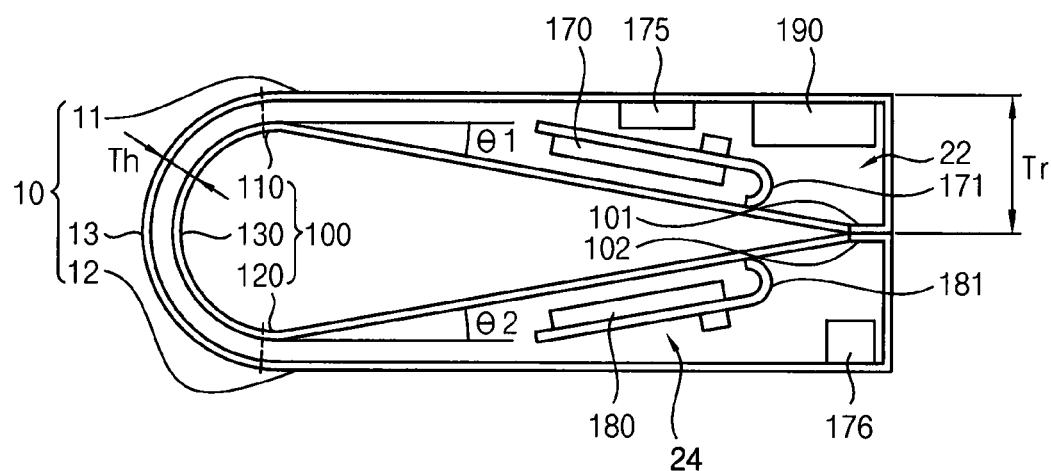
FIG. 3 is a cross-sectional view illustrating the flexible display apparatus of FIG. 1.

FIG. 1 is a plan view illustrating a flexible display apparatus according to one example embodiment of the present invention. FIG. 2 is a perspective view illustrating the flexible display apparatus of FIG. 1. FIG. 3 is a cross-sectional view illustrating the flexible display apparatus of FIG. 1.

Referring to FIGS. 1 to 3, the flexible display apparatus includes a case 10, a display panel 100, a data driver 170, a first power driver 175, a second power driver 176, a scan driver 180 and a timing controller 190.

The case 10 includes a first cover 11, a second cover 12 and a hinge cover 13. The case 10 covers the display panel 100, the data driver 170, the first power driver 175, the second power driver 176, the scan driver 180 and the timing controller 190. The first cover 11, the hinge cover 13 and the second cover 12 are adjacent to each other in sequence.

The first and second covers 11 and 12 include rigid material to have resistance against an externally provided force.

The hinge cover 13 is disposed between the first and second covers 11 and 12. The hinge cover 13 connects the first cover 11 to the second cover 12. For example, the hinge cover 13 may include a flexible material to be foldable. Alternatively, the hinge cover 13 may include a rigid material to be wrinkled, thereby being capable of extendable and contractible.

The display panel 100 includes a first display part 110, a second display part 120 and a hinge display part 130. The first display part 110, the hinge display part 130 and the second display part 120 are adjacent to each other in sequence. A rear surface of the first display part 110 is covered by the first cover 11. A rear surface of the second display part 120 is covered by the second cover 12. A rear surface of the hinge display part 130 is covered by the hinge cover 13.

For example, no other element is interposed between the rear surface of the hinge display part 130 and the hinge cover 13. The hinge cover 13 and the hinge display part 130 have a hinge thickness Th. For example, the rear surface of the hinge display part 130 directly faces the hinge cover 13.

A first element space 22 is defined between the rear surface of the first display part 110 and the first cover 11. The first display part 110 is inclined with respect to the first cover 11. For example, the first display part 110 forms a first inclined angle θ1 with respect to the first cover 11. A distance between the first display part 110 and the first cover 11 varies from the hinge thickness Th at an end adjacent to the hinge display part 130 to a peripheral thickness Tr at an opposite end that is opposite to the hinge display part 130. For example, the peripheral thickness Tr is greater than the hinge thickness Th so that the distance between the first display part 110 and the first cover 11 is increased, as a distance away from the hinge display part 130 is increased.

Elements such as a driving circuit are disposed in the first element space 22. For example, the data driver 170, a data flexible printed circuit board 171, the first power driver 175 and the timing controller 190 are disposed in the first element space 22.

The hinge display part 130 is disposed between the first display part 110 and the second display part 120 to connect the first display part 110 to the second display part 120. The hinge display part 130 includes flexible material to be foldable. When the hinge display part 130 is folded, the hinge display part 130 has a semi-circular curvature shape. When the hinge display part 130 is stretched, the hinge display part 130 has a substantially flat shape. When the flexible display apparatus is stretched, both ends 101 and 102 of the display panel 100 are extended by the cover 10 so that a tension is applied to the both ends 101 and 102 of the display panel 100. For example, an end of the first display part 110 and an end of the second display part 120 are connected to an end of the first cover 11 and an end of the second cover 12, respectively. When the first and second covers 11 and 12 are stretched, the first and second covers 11 and 12 apply the tension to the ends of the first and second display parts 110 and 120. Thus, when the case 10 is stretched, the display panel 100 has a substantially flat shape.

For example, the first display part 110, the second display part 120 and the hinge display part 130 have the same flexible material to be formed from a same layer. Alternatively, the first and second display parts 110 and 120 may have a rigid material, and only the hinge display part 130 may include the flexible material.

A second element space 24 is defined between the rear surface of the second display part 120 and the second cover 12. The second display part 120 is inclined with respect to the second cover 12. For example, the second display part 120 forms a second inclined angle θ2 with respect to the second cover 12. A distance between the second display part 120 and the second cover 12 varies from the hinge thickness Th at an end adjacent to the hinge display part 130 to a peripheral thickness Tr at an opposite end that is opposite to the hinge display part 130. The peripheral thickness Tr is greater than the hinge thickness Th so that the distance between the second display part 120 and the second cover 12 is increased, as a distance away from the hinge display part 130 is increased.

Elements such as a driving circuit are disposed in the second element space 24. For example, the second power driver 176, the scan driver 180 and the scan flexible printed circuit board 181 are disposed in the second element space 24.

A plurality of pixels PX, a plurality of scan lines S1, S2, . . . Sn, a plurality of data lines D1, D2, . . . Dm and a plurality of driving lines G1, G2, . . . Gm are disposed on the first display part 110, the second display part 120 and the hinge display part 130.

Each of the pixels PX receives a gate signal, a data signal, a first driving voltage and a second driving voltage through the scan lines S1, S2, . . . Sn, the data lines D1, D2, . . . Dm and the driving lines G1, G2, . . . Gm to display an image. For example, each of the pixels PX may include an organic light emitting element. Alternatively, each of the pixels PX may include various display elements such as a liquid crystal display element, an electrophoretic element, a plasma display element, etc.

The data driver 170 receives a data controlling signal from the timing controller 190 to apply the data signals to the data lines D1, D2, . . . Dm.

The first power driver 175 receives the driving voltage from the timing controller 190 to apply the driving voltage to the first driving voltage lines G1, G2, . . . Gm. The second power driver 176 receives the second driving voltage from the timing controller 190 to apply the second driving voltage to the second electrode 148. When each of the pixels PX has a voltage driving element, the first and second power drivers 175 and 176 may be omitted. The voltage driving element may include the liquid crystal display element, the electrophoretic element, etc.

The scan driver 180 receives a scan controlling signal from the timing controller 190 to apply the scan signals to the scan lines S1, S2, . . . Sn.

The timing controller 190 applies the data controlling signal, the first driving voltage, the second driving voltage and the scan controlling signal to the data driver 170, the first power driver 175, the second power driver 176 and the scan driver 180.

According to an example embodiment, the first and second display parts 110 and 120 are arranged to be inclined with respect to the first and second covers 11 and 12, respectively, to compensate a thickness formed by bending of the hinge display part 130. Thus, the first element space 22 is formed between the rear surface of the first display part 110 and the second element space 24 is formed between the rear surface of the second display part 120 and the second cover 12.

Also, the space formed by the bending of the hinge display part 130 is minimized so that space is effectively used. Thus, a thickness of the flexible display apparatus is decreased.

In addition, an externally provided impact that may be applied to the hinge cover 13 or the hinge display part 130 is dissipated to other portions of the flexible display apparatus, thereby preventing damage of the flexible display apparatus.

Figure 4:
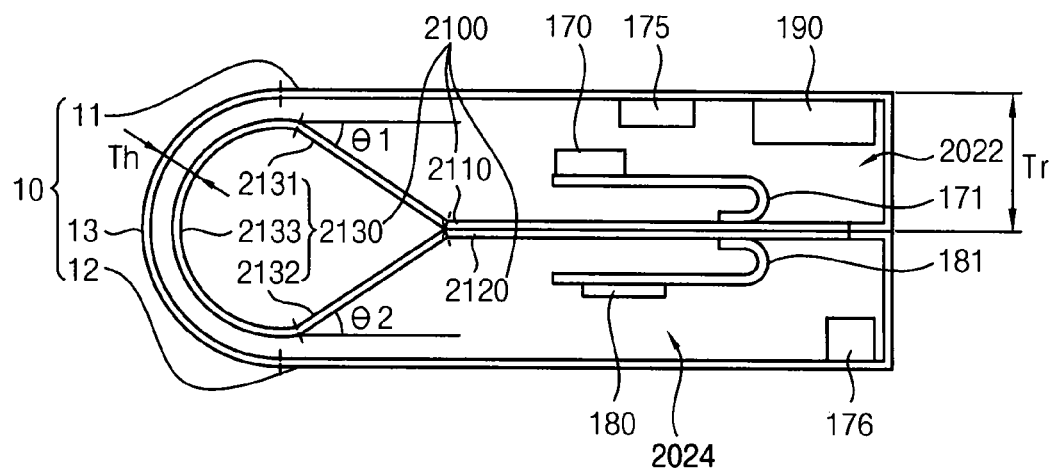
FIG. 4 is a cross-sectional view illustrating a flexible display apparatus according to another example embodiment of the present invention.

FIG. 4 is a cross-sectional view illustrating a flexible display apparatus according to another example embodiment of the present invention. The flexible display apparatus of FIG. 4 is substantially the same as shown in FIGS. 1 to 3 except a display panel, a first element space and a second element space. Thus, any repetitive explanation concerning the same elements will be omitted.

Referring to FIG. 4, the flexible display apparatus includes a case 10, a display panel 2100, a data driver 170, a first power driver 175, a second power driver 176, a scan driver 180 and a timing controller 190.

The case 10 includes a first cover 11, a second cover 12 and a hinge cover 13. The case 10 covers the display panel 2100, the data driver 170, the first power driver 175, the second power driver 176, the scan driver 180 and the timing controller 190. The first cover 11, the hinge cover 13 and the second cover 12 are adjacent to each other, in sequence.

The hinge cover 13 is disposed between the first and second covers 11 and 12. The hinge cover 13 connects the first cover 11 to the second cover 12.

The display panel 2100 includes a first display part 2110, a second display part 2120 and a hinge display part 2130. The first display part 2110, the hinge display part 2130 and the second display part 2120 are adjacent to each other, in sequence.

The hinge display part 2130 is disposed between the first display part 2110 and the second display part 2120 to connect the first display part 2110 to the second display part 2120. The hinge display part 2130 includes a first hinge portion 2131, a second hinge portion 2132 and a third hinge portion 2133. The third hinge portion 2133 includes flexible material to be foldable. When the hinge display part 2130 is folded, the hinge display part 2130 has a mixed shape of a semi-circular curvature shape and substantially flat shapes. When the hinge display part 2130 is stretched, the hinge display part 2130 has a substantially flat shape (shown in FIG. 2). When the flexible display apparatus is stretched, both ends of the display panel 2100 is extended by the cover 10 so that a tension is applied to both ends of the display panel 2100. For example, an end of the first display part 2110 and an end of the second display part 2120 are connected to an end of the first cover 11 and an end of the second cover 12, respectively. When the first and second covers 11 and 12 are stretched, the first and second covers 11 and 12 apply the tension to the ends of the first and second display parts 2110 and 2120. Thus, when the case 10 is stretched, the display panel 2100 has a substantially flat shape.

For example, the first display part 2110, the second display part 2120 and the hinge display part 2130 have same flexible material to be formed from a same layer. Alternatively, the first and second display parts 2110 and 2120 may have a rigid material, and only the hinge display part 2130 may include the flexible material. Alternatively, the first display part 2110, the second display part 2120, the first hinge portion 2131 and the second hinge portion 2132 may have a rigid material, and only the third hinge portion 2133 may include the flexible material.

The first hinge portion 2131 of the hinge display part 2130 and a rear surface of the first display part 2110 are covered by the first cover 11. The second hinge portion 2132 of the hinge display part 2130 and a rear surface of the second display part 2120 are covered by the second cover 12. The third hinge portion 2133 of the hinge display part 2130 is covered by the hinge cover 13.

For example, no other element is interposed between the rear surface of the third hinge portion 2133 of the hinge display part 2130 and the hinge cover 13. The hinge cover 13 and the rear surface of the third hinge portion 2133 of the hinge display part 2130 have a hinge thickness Th. For example, the rear surface of the third hinge portion 2133 of the hinge display part 2130 directly faces the hinge cover 13.

A first element space 2022 is defined between the first hinge portion 2131 of the hinge display part 2130, the rear surface of the first display part 2110 and the first cover 11. The first hinge portion 2131 of the hinge display part 2130 is inclined with respect to the first cover 11. The rear surface of the first display part 2110 is substantially parallel with the first cover 11. For example, the first hinge portion 2131 forms a first inclined angle θ1 with respect to the first cover 11. A distance between the first hinge portion 2131 and the first cover 11 varies from the hinge thickness Th at an end adjacent to the third hinge portion 2133 to a peripheral thickness Tr at an opposite end that is opposite to the third hinge portion 2133. For example, the peripheral thickness Tr is greater than the hinge thickness Th so that the distance between the first hinge portion 2131 and the first cover 11 is increased, as a distance away from the third hinge portion 2133 is increased. The first display part 2110 and the first cover 11 form the peripheral thickness Tr.

Elements such as a driving circuit are disposed in the first element space 2022. For example, the data driver 170, a data flexible printed circuit board 171, the first power driver 175 and the timing controller 190 are disposed in the first element space 2022.

A second element space 2024 is defined between the second hinge portion 2132 of the hinge display part 2130, the rear surface of the second display part 2120 and the second cover 12. The second hinge portion 2132 of the hinge display part 2130 is inclined with respect to the second cover 12. The rear surface of the second display part 2120 is substantially parallel with the second cover 12. For example, the second hinge portion 2132 forms a second inclined angle θ2 with respect to the second cover 12. A distance between the second hinge portion 2132 and the second cover 12 varies from the hinge thickness Th at an end adjacent to the third hinge portion 2133 to the peripheral thickness Tr at an opposite end that is opposite to the third hinge portion 2133. For example, the peripheral thickness Tr is greater than the hinge thickness Th so that the distance between the second hinge portion 2132 and the second cover 12 is increased, as a distance away from the third hinge portion 2133 is increased. The second display part 2120 and the second cover 12 form the peripheral thickness Tr.

For example, when the flexible display apparatus is folded, the third hinge portion 2133 has a curved shape similar to a semi circular curvature. When the flexible display apparatus is stretched, the third hinge portion 2133 is stretched so that the first display part 2110, the second display part 2120 and the hinge display part 2130 are arranged on a same plane.

Elements such as a driving circuit are disposed in the second element space 2024. For example, the second power driver 176, the scan driver 180 and the scan flexible printed circuit board 181 are disposed in the second element space 2024.

A plurality of pixels PX, a plurality of scan lines S1, S2, . . . Sn, a plurality of data lines D1, D2, . . . Dm and a plurality of driving lines G1, G2, . . . Gm are disposed on the first display part 2110, the second display part 2120 and the hinge display part 2130.

According to the present example embodiment, the first hinge portion 2131 and the second hinge portion 2132 of the hinge display part 2130 are inclined with respect to the first and second covers 11 and 12, respectively. Also, the first and second display parts 2110 and 2120 are substantially parallel with respect to the first and second covers 11 and 12. Thus, a thickness formed by the bending of the hinge display part 2130 is compensated. Also, the first element space 2022 is formed between the rear surface of the first hinge portion 2131, the rear surface of the first display part 2110 and the first cover 11, and the second element space 2024 is formed between the rear surface of the second hinge portion 2132, the rear surface of the second display part 2120 and the second cover 12.

The size of the first and second element spaces 2022 and 2024 are maximized so that the elements may be integrated into the first and second element spaces 2022 and 2024.

Thus, the space formed by the bending of the hinge display part 130 is effectively used to decrease the thickness of the flexible display apparatus.

Figure 5:
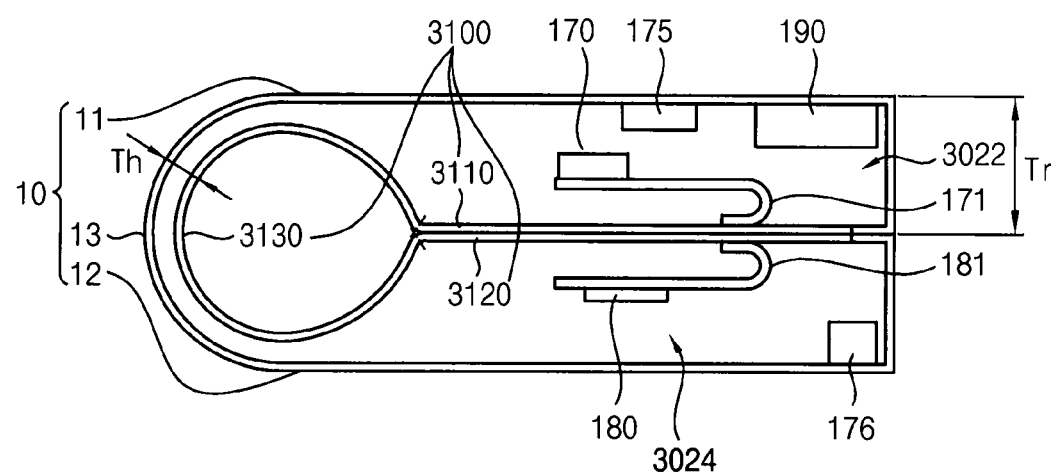
FIG. 5 is a cross-sectional view illustrating a flexible display apparatus according to still another example embodiment of the present invention.

FIG. 5 is a cross-sectional view illustrating a flexible display apparatus according to still another example embodiment of the present invention. The flexible display apparatus of FIG. 5 is substantially the same as shown in FIGS. 1 to 3 except a display panel, a first element space and a second element space. Thus, any repetitive explanation concerning the same elements will be omitted.

Referring to FIG. 5, the flexible display apparatus includes a case 10, a display panel 3100, a data driver 170, a first power driver 175, a second power driver 176, a scan driver 180 and a timing controller 190.

The case 10 includes a first cover 11, a second cover 12 and a hinge cover 13. The case 10 covers the display panel 3100, the data driver 170, the first power driver 175, the second power driver 176, the scan driver 180 and the timing controller 190. The first cover 11, the hinge cover 13 and the second cover 12 are adjacent to each other, in sequence.

The display panel 3100 includes a first display part 3110, a second display part 3120 and a hinge display part 3130. The first display part 3110, the hinge display part 3130 and the second display part 3120 are adjacent to each other, in sequence.

The hinge display part 3130 is disposed between the first display part 3110 and the second display part 3120 to connect the first display part 3110 to the second display part 3120. The hinge display part 3130 includes flexible material to be foldable. When the hinge display part 3130 is folded, the hinge display part 3130 has a curved shape similar to a cylindrical shape. When the hinge display part 3130 is stretched, the hinge display part 3130 has a substantially flat shape (shown in FIG. 2). For example, the first display part 3110, the second display part 3120 and the hinge display part 3130 have the same flexible material to be formed from a same layer. Alternatively, the first and second display parts 3110 and 3120 may have a rigid material, and only the hinge display part 3130 may include the flexible material.

A rear surface of the first display part 3110 and a rear surface of a portion of the hinge display part 3130 adjacent to the first display part 3110 are covered by the first cover 11. A rear surface of the second display part 3120 and a rear surface of a portion of the hinge display part 3130 adjacent to the second display part 3120 are covered by the second cover 12. A central portion of the hinge display part 3130 is covered by the hinge cover 13.

For example, no other element is interposed between the rear surface of the central portion of the hinge display part 3130 and the hinge cover 13. The hinge cover 13 and the rear surface of the hinge display part 3130 have a hinge thickness Th. For example, the rear surface of the hinge display part 3130 directly faces the hinge cover 13.

A first element space 3022 is defined between the rear surface of the first display part 3110, the portion of the hinge display part 3130 adjacent to the first display part 3110 and the first cover 11. The portion of the hinge display part 3130 adjacent to the first display part 3110 has a curved shape. The rear surface of the first display part 3110 is substantially parallel with the first cover 11. A distance between the hinge display part 3130 and the first cover 11 varies from the hinge thickness Th at the central portion of the hinge display part 3130 to a peripheral thickness Tr at an end of the hinge display part 3130 adjacent to the first display part 3110. For example, the peripheral thickness Tr is greater than the hinge thickness Th so that the distance between the hinge display part 3130 and the first cover 11 is increased, as a distance from the first display part 3110 is decreased. The first display part 3110 and the first cover 11 form the peripheral thickness Tr.

Elements such as a driving circuit are disposed in the first element space 3022. For example, the data driver 170, a data flexible printed circuit board 171, the first power driver 175 and the timing controller 190 are disposed in the first element space 3022.

A second element space 3024 is defined between the rear surface of the second display part 3120, the portion of the hinge display part 3130 adjacent to the second display part 3120 and the second cover 12. The portion of the hinge display part 3130 adjacent to the second display part 3120 has a curved shape. The rear surface of the second display part 3120 is substantially parallel with the second cover 12. A distance between the hinge display part 3130 and the second cover 12 varies from the hinge thickness Th at the central portion of the hinge display part 3130 to the peripheral thickness Tr at an end of the hinge display part 3130 adjacent to the second display part 3120. For example, the peripheral thickness Tr is greater than the hinge thickness Th so that the distance between the hinge display part 3130 and the second cover 12 is increased, as a distance from the second display part 3120 is decreased. The second display part 3120 and the second cover 12 form the peripheral thickness Tr.

Elements such as a driving circuit are disposed in the second element space 3024. For example, the second power driver 176, the scan driver 180 and the scan flexible printed circuit board 181 are disposed in the second element space 3024.

A plurality of pixels PX, a plurality of scan lines S1, S2, . . . Sn, a plurality of data lines D1, D2, . . . Dm and a plurality of driving lines G1, G2, . . . Gm are disposed on the first display part 3110, the second display part 3120 and the hinge display part 3130.

According to the present example embodiment, the first and second element spaces 3022 and 3024 are maximized, so that the elements may be more integrated into the first and second element spaces 3022 and 3024.

Thus, the space formed by the bending of the hinge display part 3130 may be effectively used to decrease the thickness of the flexible display apparatus.

Figure 6:
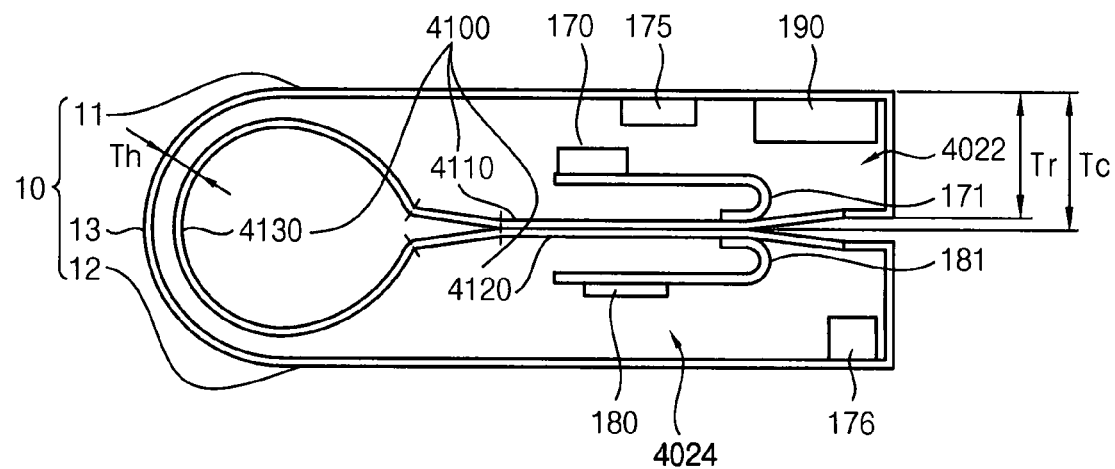
FIG. 6 is a cross-sectional view illustrating a flexible display apparatus according to further still another example embodiment of the present invention.

FIG. 6 is a cross-sectional view illustrating a flexible display apparatus according to further still another example embodiment of the present invention. The flexible display apparatus of FIG. 6 is substantially the same as shown in FIGS. 1 to 3 except a display panel, a first element space and a second element space. Thus, any repetitive explanation concerning the same elements will be omitted.

Referring to FIG. 6, the flexible display apparatus includes a case 10, a display panel 4100, a data driver 170, a first power driver 175, a second power driver 176, a scan driver 180 and a timing controller 190.

The case 10 includes a first cover 11, a second cover 12 and a hinge cover 13. The case 10 covers the display panel 4100, the data driver 170, the first power driver 175, the second power driver 176, the scan driver 180 and the timing controller 190. The first cover 11, the hinge cover 13 and the second cover 12 are adjacent to each other, in sequence.

The display panel 4100 includes a first display part 4110, a second display part 4120 and a hinge display part 4130. The first display part 4110, the hinge display part 4130 and the second display part 4120 are adjacent to each other, in sequence.

The hinge display part 4130 is disposed between the first display part 4110 and the second display part 4120 to connect the first display part 4110 to the second display part 4120. The hinge display part 4130 includes flexible material to be foldable. When the hinge display part 4130 is folded, the hinge display part 4130 has a curved shape similar to a cylindrical shape. When the hinge display part 4130 is stretched, the hinge display part 4130 has a substantially flat shape (shown in FIG. 2). Thus, when the case 10 is stretched, the display panel 4100 has a substantially flat shape.

A rear surface of the first display part 4110 and a rear surface of a portion of the hinge display part 4130 adjacent to the first display part 4110 are covered by the first cover 11. A rear surface of the second display part 4120 and a rear surface of a portion of the hinge display part 4130 adjacent to the second display part 4120 are covered by the second cover 12. A central portion of the hinge display part 4130 is covered by the hinge cover 13.

For example, no other element is interposed between the rear surface of the central portion of the hinge display part 4130 and the hinge cover 13. The hinge cover 13 and the rear surface of the hinge display part 4130 have a hinge thickness Th. For example, the rear surface of the hinge display part 4130 directly faces the hinge cover 13.

The first display part 4110 has a flexible material to be folded. When the flexible display apparatus is folded, the first display part 4110 has a convex shape protruded in a direction opposite to the first cover 11. When the flexible display apparatus is stretched, the first display part 4110 has a substantially flat shape.

A first element space 4022 is defined between the rear surface of the first display part 4110, the portion of the hinge display part 4130 adjacent to the first display part 4110 and the first cover 11. The portion of the hinge display part 4130 adjacent to the first display part 4110 has a curved shape. A distance between the hinge display part 4130 and the first cover 11 varies from the hinge thickness Th at the central portion of the hinge display part 4130 to a peripheral thickness Tr at an end of the hinge display part 4130 adjacent to the first display part 4110. For example, the peripheral thickness Tr is greater than the hinge thickness Th so that the distance between the hinge display part 4130 and the first cover 11 is increased, as a distance from the first display part 4110 is decreased.

The first display part 4110 and the first cover 11 form the peripheral thickness Tr. An end of a central portion of the first display part 4110 and the first cover 11 form a central thickness Tc. For example, the central thickness Tc is greater than the peripheral thickness Tr.

Elements such as a driving circuit are disposed in the first element space 4022. For example, the data driver 170, a data flexible printed circuit board 171, the first power driver 175 and the timing controller 190 are disposed in the first element space 4022.

The second display part 4120 includes a flexible material that may be bent. When the flexible display apparatus is folded, the second cover 12 has a convex shape protruded in a direction opposite to the second cover. When the flexible display apparatus is stretched, the second display part 4120 has a substantially flat shape (shown in FIG. 2).

A second element space 4024 is defined between the rear surface of the second display part 4120, the portion of the hinge display part 4130 adjacent to the second display part 4120 and the second cover 12. The portion of the hinge display part 4130 adjacent to the second display part 4120 has a curved shape. A distance between the hinge display part 4130 and the second cover 12 varies from the hinge thickness Th at the central portion of the hinge display part 4130 to the peripheral thickness Tr at an end of the hinge display part 4130 adjacent to the second display part 4120. For example, the peripheral thickness Tr is greater than the hinge thickness Th so that the distance between the hinge display part 4130 and the second cover 12 is increased, as a distance from the second display part 4120 is decreased. The second display part 4120 and the second cover 12 form the peripheral thickness Tr.

The end of the second display part 4120 and the second cover 12 form the peripheral thickness Tr. The central portion of the second display part 4120 and the second cover 12 form the central thickness Tc.

Elements such as a driving circuit are disposed in the second element space 4024. For example, the second power driver 176, the scan driver 180 and the scan flexible printed circuit board 181 are disposed in the second element space 4024.

A plurality of pixels PX, a plurality of scan lines S1, S2, . . . Sn, a plurality of data lines D1, D2, . . . Dm and a plurality of driving lines G1, G2, . . . Gm are disposed on the first display part 4110, the second display part 4120 and the hinge display part 4130.

When the flexible display apparatus is stretched, both ends of the display panel 4100 are extended by the cover 10 so that a tension is applied to the both ends of the display panel 4100. Thus, when the case 10 is stretched, the display panel 4100 has a substantially flat shape. For example, an end of the first display part 4110 and an end of the second display part 4120 are connected to an end of the first cover 11 and an end of the second cover 12, respectively. When the first and second covers 11 and 12 are stretched, the first and second covers 11 and 12 apply the tension to the ends of the first and second display parts 4110 and 4120. The tension applied to the ends of the first and second display parts 4110 and 4120 is transmitted to the first display part 4110, the second display part 4120 and the hinge display part 4130 so that the display panel 4100 has a substantially flat shape.

According to the present example embodiment, when the display panel 4100 is folded, the first and second display parts 4110 and 4120 have the curved shapes facing each other to absorb an externally provided impact. Thus, the elements are protected from the externally provided impact, thereby improving credibility.

Figure 7:
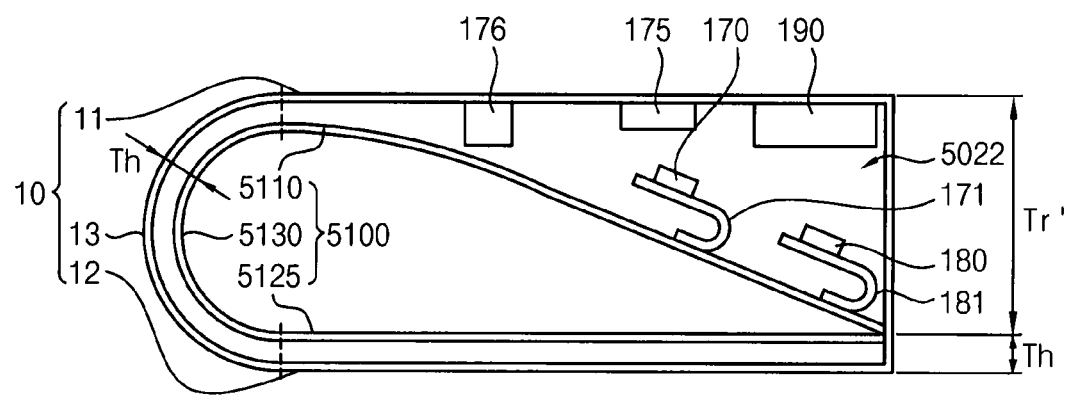
FIG. 7 is a cross-sectional view illustrating a flexible display apparatus according to further still another example embodiment of the present invention.

FIG. 7 is a cross-sectional view illustrating a flexible display apparatus according to further still another example embodiment of the present invention. The flexible display apparatus of FIG. 7 is substantially the same as shown in FIGS. 1 to 3 except a display panel, a first element space and a second element space. Thus, any repetitive explanation concerning the same elements will be omitted.

Referring to FIG. 7, the flexible display apparatus includes a case 10, a display panel 5100, a data driver 170, a first power driver 175, a second power driver 176, a scan driver 180 and a timing controller 190.

The case 10 includes a first cover 11, a second cover 12 and a hinge cover 13. The case 10 covers the display panel 5100, the data driver 170, the first power driver 175, the second power driver 176, the scan driver 180 and the timing controller 190. The first cover 11, the hinge cover 13 and the second cover 12 are adjacent to each other, in sequence.

The display panel 5100 includes a first display part 5110, a second display part 5125 and a hinge display part 5130. The first display part 5110, the hinge display part 5130 and the second display part 5125 are adjacent to each other, in sequence.

The hinge display part 5130 is disposed between the first display part 5110 and the second display part 5125 to connect the first display part 5110 to the second display part 5125. The hinge display part 5130 includes flexible material to be foldable. When the hinge display part 5130 is folded, the hinge display part 5130 has a curved shape similar to a semi cylindrical shape. When the hinge display part 5130 is stretched, the hinge display part 5130 has a substantially flat shape (shown in FIG. 2).

A rear surface of the first display part 5110 is covered by the first cover 11. A rear surface of the second display part 5125 is covered by the second cover 12. A central portion of the hinge display part 5130 is covered by the hinge cover 13.

For example, no other element is interposed between the rear surface of the hinge display part 5130 and the hinge cover 13. The hinge cover 13 and the rear surface of the hinge display part 5130 have a hinge thickness Th. For example, the rear surface of the hinge display part 5130 directly faces the hinge cover 13.

The first display part 5110 has a flexible material to be folded. When the flexible display apparatus is folded, the first display part 5110 has a convex shape protruded toward the first cover 11. When the flexible display apparatus is stretched, the first display part 5110 has a substantially flat shape.

A first element space 5022 is defined between the rear surface of the first display part 5110 and the first cover 11. A distance between the first display part 5110 and the first cover 11 varies from the hinge thickness Th adjacent to the hinge display part 5130 to a peripheral thickness Tr at an end of the display panel 5100. For example, the peripheral thickness Tr is greater than the hinge thickness Th so that the distance between the first display part 5110 and the first cover 11 is increased, as a distance from the hinge display part 5130 is increased.

Elements such as a driving circuit are disposed in the first element space 5022. For example, the data driver 170, a data flexible printed circuit board 171, the first power driver 175, a scan driver 180, a scan flexible printed circuit board 181, a second power driver 176 and the timing controller 190 are disposed in the first element space 5022.

The second display part 5125 includes a flexible material. The second display part 5125 has a substantially flat shape regardless of folding or stretching of the flexible display apparatus. Alternatively, the second display part 5125 may include a rigid material.

The second display part 5125 and the second cover 12 form the hinge thickness.

A plurality of pixels PX, a plurality of scan lines S1, S2, . . . Sn, a plurality of data lines D1, D2, . . . Dm and a plurality of driving lines G1, G2, . . . Gm are disposed on the first display part 5110, the second display part 5125 and the hinge display part 5130.

When the flexible display apparatus is stretched, both ends of the display panel 5100 is extended by the cover 10 so that a tension is applied to the both ends of the display panel 5100. An end of the first display part 5110 and an end of the second display part 5125 are connected to an end of the first cover 11 and an end of the second cover 12, respectively. When the first and second covers 11 and 12 are stretched, the first and second covers 11 and 12 apply the tension to the ends of the first and second display parts 5110 and 5125. The tension applied to the ends of the first and second display parts 5110 and 5125 is transmitted to the first display part 5110, the second display part 5125 and the hinge display part 5130 so that the display panel 5100 has a substantially flat shape.

According to the present example embodiment, a lot of elements are integrated into the first element space 5022 so that fabrication of the flexible display apparatus may be simplified.

Figure 8:
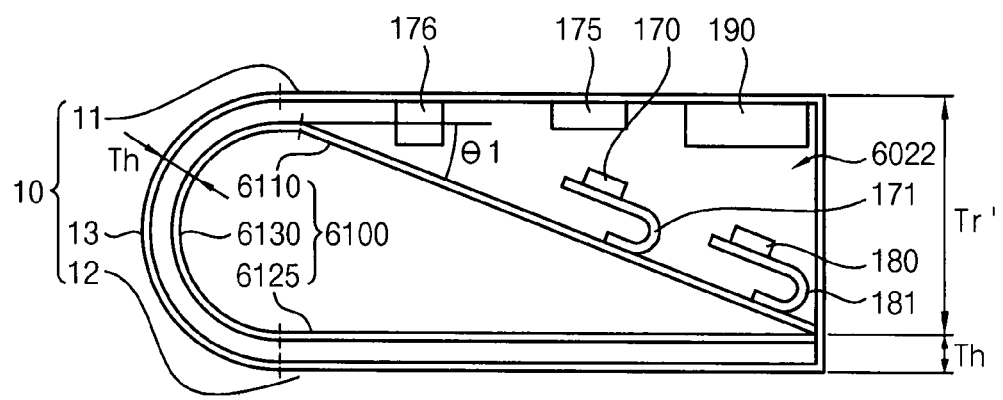
FIG. 8 is a cross-sectional view illustrating a flexible display apparatus according to further still another example embodiment of the present invention.

FIG. 8 is a cross-sectional view illustrating a flexible display apparatus according to further still another example embodiment of the present invention. The flexible display apparatus of FIG. 8 is substantially the same as shown in FIGS. 1 to 3 except a display panel, a first element space and a second element space. Thus, any repetitive explanation concerning the same elements will be omitted.

Referring to FIG. 8, the flexible display apparatus includes a case 10, a display panel 6100, a data driver 170, a first power driver 175, a second power driver 176, a scan driver 180 and a timing controller 190.

The case 10 includes a first cover 11, a second cover 12 and a hinge cover 13. The case 10 covers the display panel 6100, the data driver 170, the first power driver 175, the second power driver 176, the scan driver 180 and the timing controller 190. The first cover 11, the hinge cover 13 and the second cover 12 are adjacent to each other, in sequence.

The display panel 6100 includes a first display part 6110, a second display part 6125 and a hinge display part 6130. The first display part 6110, the hinge display part 6130 and the second display part 6125 are adjacent to each other, in sequence. In the present example embodiment, the hinge display part 6130 and the second display part 6125 are substantially the same as the hinge display part 5130 and the second display part 5125 of FIG. 7. Thus, any repetitive explanation concerning the hinge display part and the second display part will be omitted.

A rear surface of the first display part 6110 is covered by the first cover 11.

The first display part 6110 has a flexible material to be folded. When the flexible display apparatus is folded, the first display part 6110 is inclined at an inclined angle θ3 with respect to the first cover 11. For example, the first display part 6110 has a substantially flat shape although the flexible display apparatus is folded.

A first element space 6022 is defined between the rear surface of the first display part 6110 and the first cover 11. A distance between the first display part 6110 and the first cover 11 varies from the hinge thickness Th adjacent to the hinge display part 6130 to a peripheral thickness Tr at an end of the display panel 6100. For example, the peripheral thickness Tr is greater than the hinge thickness Th so that the distance between the first display part 6110 and the first cover 11 is increased, as a distance from the hinge display part 6130 is increased.

Elements such as a driving circuit are disposed in the first element space 6022. For example, the data driver 170, a data flexible printed circuit board 171, the first power driver 175, a scan driver 180, a scan flexible printed circuit board 181, a second power driver 176 and the timing controller 190 are disposed in the first element space 6022.

A plurality of pixels PX, a plurality of scan lines S1, S2, . . . Sn, a plurality of data lines D1, D2, . . . Dm and a plurality of driving lines G1, G2, . . . Gm are disposed on the first display part 6110, the second display part 6125 and the hinge display part 6130.

When the flexible display apparatus is stretched, both ends of the display panel 6100 is extended by the cover 10 so that a tension is applied to the both ends of the display panel 6100. For example, an end of the first display part 6110 and an end of the second display part 6125 are connected to an end of the first cover 11 and an end of the second cover 12, respectively. When the first and second covers 11 and 12 are stretched, the first and second covers 11 and 12 apply the tension to the ends of the first and second display parts 6110 and 6125. The tension applied to the ends of the first and second display parts 6110 and 6125 is transmitted to the first display part 6110, the second display part 6125 and the hinge display part 6130 so that the display panel 6100 has a substantially flat shape.

According to the present example embodiment, a lot of the elements are integrated into the first element space 6022 so that the flexible display apparatus may be easily fabricated. Also, the size of the first element space 6022 is increased regardless of the size of the flexible display apparatus. Thus, the size and thickness of the flexible display apparatus may be decreased.

Figure 9:
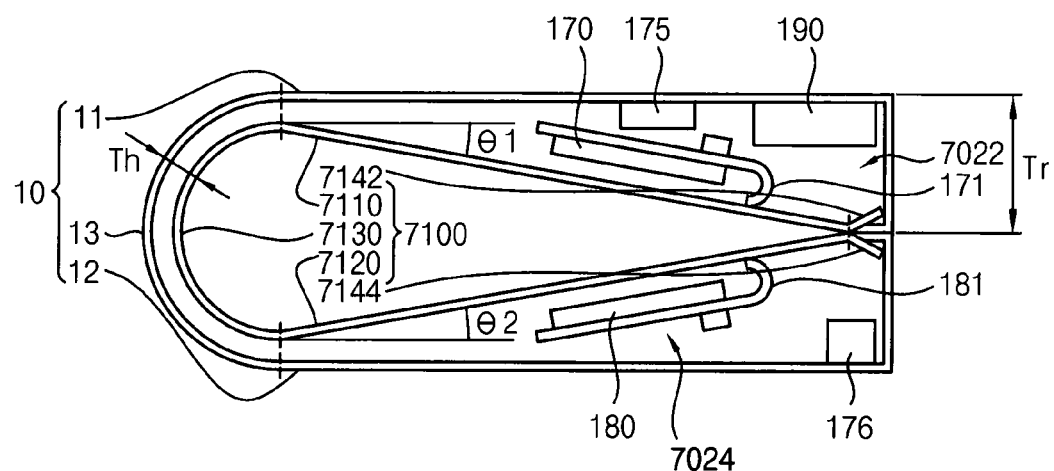
FIG. 9 is a cross-sectional view illustrating a flexible display apparatus according to further still another example embodiment of the present invention.

FIG. 9 is a cross-sectional view illustrating a flexible display apparatus according to further still another example embodiment of the present invention. The flexible display apparatus of FIG. 9 is substantially the same as shown in FIGS. 1 to 3 except a display panel, a first element space and a second element space. Thus, any repetitive explanation concerning the same elements will be omitted.

Referring to FIG. 9, the flexible display apparatus includes a case 10, a display panel 7100, a data driver 170, a first power driver 175, a second power driver 176, a scan driver 180 and a timing controller 190.

The case 10 includes a first cover 11, a second cover 12 and a hinge cover 13. The case 10 covers the display panel 7100, the data driver 170, the first power driver 175, the second power driver 176, the scan driver 180 and the timing controller 190. The first cover 11, the hinge cover 13 and the second cover 12 are adjacent to each other, in sequence.

The display panel 7100 includes a first display part 7110, a second display part 7120, a hinge display part 7130, a first extended part 7142 and a second extended part 7144. The first extended part 7142, the first display part 7110, the hinge display part 7130, the second display part 7120 and the second extended part 7144 are adjacent to each other, in sequence.

A first element space 7022 is defined between the rear surface of the first display part 7110 and the first cover 11. The first display part 7110 is inclined with respect to the first cover 11. For example, the first display part 710 may be inclined at a first angle θ1 with respect to the first cover 11.

The first extended part 7142 is extended from an end of the first display part 7110 toward the first element space 7022. The first extended part 7142 is connected to an end of the first cover 11. The first extended part 7142 increases combining strength between the display panel 7100 and the first cover 11.

Elements such as a driving circuit are disposed in the first element space 7022. For example, the first extended part 7142, the data driver 170, a data flexible printed circuit board 171, the first power driver 175 and the timing controller 190 are disposed in the first element space 7022.

A second element space 7024 is defined between a rear surface of the second display part 7120 and the second cover 12. The second display part 7120 is inclined with respect to the second cover 12. For example, the second display part 7120 may be inclined at a second angle θ2 with respect to the second cover 12.

The second extended part 7144 is extended from an end of the second display part 7120 toward the second element space 7024. The second extended part 7144 is connected to an end of the second cover 12. The second extended part 7144 increases combining strength between the display panel 7100 and the second cover 12.

Elements such as a driving circuit are disposed in the second element space 7024. For example, the second extended part 7144, the scan driver 180 and a scan flexible printed circuit board 181 are disposed in the second element space 7024.

When the hinge display part 7130 is folded, the hinge display part 7130 has a curved shape similar to a semi circular shape. When the hinge display part 7130 is stretched, the hinge display part 7130 has a substantially flat shape. When the flexible display apparatus is stretched, both ends of the display panel 7100 is extended by the cover 10 so that a tension is applied to the both ends of the display panel 7100. An end of the first display part 7110 and an end of the second display part 7120 are connected to an end of the first cover 11 and an end of the second cover 12, respectively. When the first and second covers 11 and 12 are stretched, the first and second covers 11 and 12 apply the tension to the ends of the first and second display parts 7110 and 7120. The tension applied to the ends of the first and second display parts 7110 and 7120 is transmitted to the first display part 7110, the second display part 7120 and the hinge display part 7130 so that the display panel 7100 has a substantially flat shape.

According to the present example embodiment, the display panel 7100 further includes the first and second extended parts 7142 and 7144, so that the display panel 7100 is securely combined with the first and second covers 11 and 12. Thus, a defect of dislocation cased by separation of the ends of the display panel 7100 from the first cover 11 or the second cover 12 during the folding and stretching the flexible display apparatus may be decreased.

Figure 10:
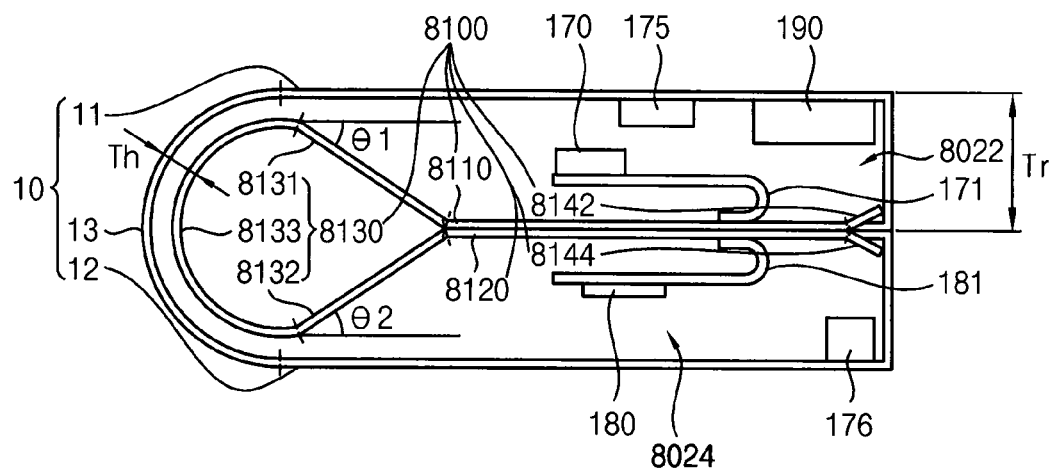
FIG. 10 is a cross-sectional view illustrating a flexible display apparatus according to further still another example embodiment of the present invention.

FIG. 10 is a cross-sectional view illustrating a flexible display apparatus according to further still another example embodiment of the present invention. The flexible display apparatus of FIG. 10 is substantially the same as shown in FIGS. 1 to 3 except a display panel, a first element space and a second element space. Thus, any repetitive explanation concerning the same elements will be omitted.

Referring to FIG. 10, the flexible display apparatus includes a case 10, a display panel 8100, a data driver 170, a first power driver 175, a second power driver 176, a scan driver 180 and a timing controller 190.

The display panel 8100 includes a first display part 8110, a second display part 8120, a hinge display part 8130, a first extended part 8142 and a second extended part 8144. The first extended part 8142, the first display part 8110, the hinge display part 8130, the second display part 8120 and the second extended part 8144 are adjacent to each other, in sequence.

For example, the hinge display part 8130 includes a first hinge portion 8131, a second hinge portion 8132 and a third hinge portion 8133. When the flexible display apparatus is folded, the hinge display part 8130 has a folded shape. When the hinge display part 8130 is stretched, the hinge display part 8130 has a substantially flat shape (shown in FIG. 2).

A first element space 8022 is defined between a rear surface of the first hinge portion 8131, a rear surface of the first display part 8110 and the first cover 11. The first hinge portion 8131 is inclined with respect to the first cover 11. For example, the first hinge portion 8131 may be inclined at a first inclined angle θ1 with respect to the first cover 11.

The first extended part 8142 is extended from an end of the first display part 8110 toward the first element space 8022. The first extended part 8142 is connected to an end of the first cover 11. The first extended part 8142 increases combining strength between the display panel 8100 and the first cover 11.

Elements such as the first extended part 8142, a driving circuit, etc., are disposed in the first element space 8022. For example, the first extended part 8142, the data driver 170, a data flexible printed circuit board 171, the first power driver 175 and the timing controller 190 are disposed in the first element space 8022.

A second element space 8024 is defined between a rear surface of the second hinge portion 8132, a rear surface of the second display part 8120 and the second cover 12. The second hinge portion 8132 is inclined with respect to the second cover 12. For example, the second hinge portion 8132 may be inclined at a second inclined angle θ2 with respect to the second cover 12.

The second extended part 8144 is extended from an end of the second display part 8120 toward the second element space 8024. The second extended part 8144 is connected to an end of the second cover 12. The second extended part 8144 increases combining strength between the display panel 8100 and the second cover 12.

Elements such as the second extended part 8144, a driving circuit, etc., are disposed in the first element space 8024. For example, the second extended part 8144, the scan driver 180 and the scan flexible printed circuit board 181 are disposed in the second element space 8024.

When the flexible display apparatus is folded, the hinge display part 8130 has a mixed shape including a curved shape and a substantially flat shape. That is, the first and second hinge portions 8131 and 8132 of the hinge display part 8130 have the substantially flat shape, and the third hinge portion 8133 of the hinge display part 8130 has the substantially curved shape similar to a semi circular shape. When the flexible display apparatus is stretched, the hinge display part 8130 has a substantially flat shape. When the flexible display apparatus is stretched, both ends of the display panel 8100 is extended by the cover 10 so that a tension is applied to the both ends of the display panel 8100. An end of the first display part 8110 and an end of the second display part 8120 are connected to an end of the first cover 11 and an end of the second cover 12, respectively. When the first and second covers 11 and 12 are stretched, the first and second covers 11 and 12 apply the tension to the ends of the first and second display parts 8110 and 8120. The tension applied to the ends of the first and second display parts 8110 and 8120 is transmitted to the first and second extended parts 8142 and 8144, the first and second display parts 8110 and 8120 and the hinge display part 8130 so that the display panel 8100 has a substantially flat shape.

According to the present example embodiment, the display panel 8100 includes the first and second extended parts 8142 and 8144, so that the display panel 8100 is securely combined with the first and second covers 11 and 12. Thus, a defect of dislocation cased by separation of the ends of the display panel 8100 from the first cover 11 or the second cover 12 during the folding and stretching the flexible display apparatus may be decreased.

Figure 11:
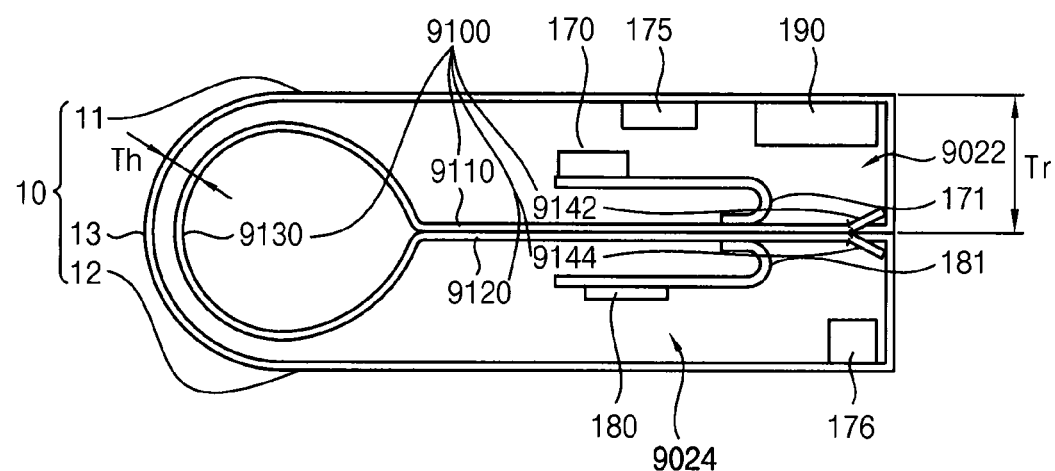
FIG. 11 is a cross-sectional view illustrating a flexible display apparatus according to further still another example embodiment of the present invention.

FIG. 11 is a cross-sectional view illustrating a flexible display apparatus according to further still another example embodiment of the present invention. The flexible display apparatus of FIG. 11 is substantially the same as shown in FIGS. 1 to 3 except a display panel, a first element space and a second element space. Thus, any repetitive explanation concerning the same elements will be omitted.

Referring to FIG. 11, the flexible display apparatus includes a case 10, a display panel 9100, a data driver 170, a first power driver 175, a second power driver 176, a scan driver 180 and a timing controller 190.

The display panel 9100 includes a first display part 9110, a second display part 9120, a hinge display part 9130, a first extended part 9142 and a second extended part 9144. The first extended part 9142, the first display part 9110, the hinge display part 9130, the second display part 9120 and the second extended part 9144 are adjacent to each other, in sequence.

For example, the hinge display part 9130 is disposed between the first and second display parts 9110 and 9120 to connect the first display part 9110 to the second display part 9120. When the flexible display apparatus is folded, the hinge display part 9130 has a curved shape similar to a cylindrical shape. When the hinge display part 9130 is stretched, the hinge display part 9130 has a substantially flat shape (shown in FIG. 2).

A rear surface of the first display part 9110 and a rear surface of a portion of the hinge display part 9130 adjacent to the first display part 9110 are covered by the first cover 11. A rear surface of the second display part 9120 and a rear surface of a portion of the hinge display part 9130 adjacent to the second display part 9120 are covered by the second cover 12. A rear surface of a central portion of the hinge display part 9130 is covered by the hinge cover 13.

The rear surface of the first display part 9110, the rear surface of the portion of the hinge display part 9130 adjacent to the first display part 9110 and the first cover 11 define a first element space 9022. The portion of the hinge display part 9130 adjacent to the first display part 9110 has a curved shape. The rear surface of the first display part 9110 is substantially parallel with the first cover 11.

The first extended part 9142 is extended from an end of the first display part 9110 toward the first element space 9022. The first extended part 9142 is connected to an end of the first cover 11. The first extended part 9142 increases combining strength between the display panel 9100 and the first cover 11.

Elements such as the first extended part 9142, a driving circuit, etc., are disposed in the first element space 9022. For example, the first extended part 9142, the data driver 170, a data flexible printed circuit board 171, the first power driver 175 and the timing controller 190 are disposed in the first element space 9022.

A second element space 9024 is defined between a rear surface of the second display part 9120, a rear surface of a portion of the hinge display part 9130 adjacent to the second display part 9120 and the second cover 12. The portion of the hinge display part 9130 adjacent to the second display part 9120 has a curved shape. The rear surface of the second display part 9120 is substantially parallel with the second cover 12.

The second extended part 9144 is extended from an end of the second display part 9120 toward the second element space 9024. The second extended part 9144 is connected to an end of the second cover 12. The second extended part 9144 increases combining strength between the display panel 9100 and the second cover 12.

Elements such as the second extended part 9144, a driving circuit, etc., are disposed in the first element space 9024. For example, the second extended part 9144, the second power driver 176, the scan driver 180 and the scan flexible printed circuit board 181 are disposed in the second element space 9024.

When the flexible display apparatus is folded, the hinge display part 9130 has a curved shape similar to a cylindrical shape. When the flexible display apparatus is stretched, the hinge display part 9130 has a substantially flat shape. When the flexible display apparatus is stretched, both ends of the display panel 9100 is extended by the cover 10 so that a tension is applied to the both ends of the display panel 9100. An end of the first display part 9110 and an end of the second display part 9120 are connected to an end of the first cover 11 and an end of the second cover 12, respectively. When the first and second covers 11 and 12 are stretched, the first and second covers 11 and 12 apply the tension to the ends of the first and second display parts 9110 and 9120. The tension applied to the ends of the first and second display parts 9110 and 9120 is transmitted to the first and second extended parts 9142 and 9144, the first and second display parts 9110 and 9120 and the hinge display part 9130 so that the display panel 9100 has a substantially flat shape.

According to the present example embodiment, the display panel 9100 includes the first and second extended parts 9142 and 9144, so that the display panel 9100 is securely combined with the first and second covers 11 and 12.

Figure 12:
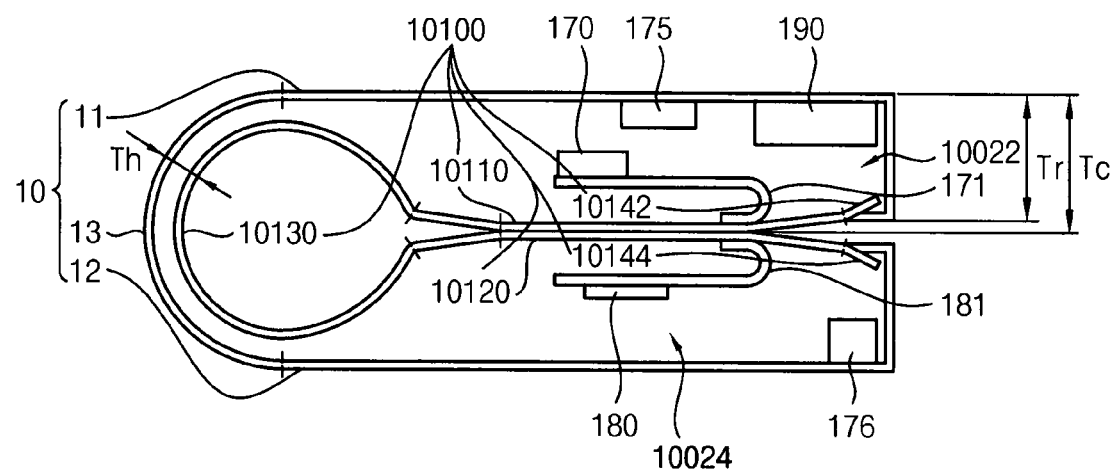
FIG. 12 is a cross-sectional view illustrating a flexible display apparatus according to further still another example embodiment of the present invention.

FIG. 12 is a cross-sectional view illustrating a flexible display apparatus according to further still another example embodiment of the present invention. The flexible display apparatus of FIG. 12 is substantially the same as shown in FIGS. 1 to 3 except a display panel, a first element space and a second element space. Thus, any repetitive explanation concerning the same elements will be omitted.

Referring to FIG. 12, the flexible display apparatus includes a case 10, a display panel 10100, a data driver 170, a first power driver 175, a second power driver 176, a scan driver 180 and a timing controller 190.

The display panel 10100 includes a first display part 10110, a second display part 10120, a hinge display part 10130, a first extended part 10142 and a second extended part 10144. The first extended part 10142, the first display part 10110, the hinge display part 10130, the second display part 10120 and the second extended part 10144 are adjacent to each other, in sequence.

For example, the hinge display part 10130 is disposed between the first and second display parts 10110 and 10120 to connect the first display part 10110 to the second display part 10120. For example, the hinge display part 10130 includes a flexible material to be foldable. When the flexible display apparatus is folded, the hinge display part 10130 has a curved shape similar to a cylindrical shape. When the hinge display part 10130 is stretched, the hinge display part 10130 has a substantially flat shape (shown in FIG. 2).

The first display part 10110 includes a flexible material. When the flexible display apparatus is folded, the first display part 10110 has a convex shape protruded in a direction opposite to the first cover. When the flexible display apparatus is stretched, the first display part 10110 has a substantially flat shape.

A rear surface of the first display part 10110, a rear surface of a portion of the hinge display part 10130 adjacent to the first display part 10110 and the first cover 11 define a first element space 10022.

The first extended part 10142 is extended from an end of the first display part 10110 toward the first element space 10022. The first extended part 10142 is connected to an end of the first cover 11. The first extended part 10142 increases combining strength between the display panel 10100 and the first cover 11.

Elements such as the first extended part 10142, a driving circuit, etc., are disposed in the first element space 10022.

For example, the first extended part 10142, the data driver 170, a data flexible printed circuit board 171, the first power driver 175 and the timing controller 190 are disposed in the first element space 10022.

A second element space 10024 is defined between a rear surface of the second display part 10120, a rear surface of a portion of the hinge display part 10130 adjacent to the second display part 10120 and the second cover 12.

The second extended part 10144 is extended from an end of the second display part 10120 toward the second element space 10024. The second extended part 10144 is connected to an end of the second cover 12. The second extended part 10144 increases combining strength between the display panel 10100 and the second cover 12.

Elements such as the second extended part 10144, a driving circuit, etc., are disposed in the first element space 10024. For example, the second extended part 10144, the second power driver 176, the scan driver 180 and the scan flexible printed circuit board 181 are disposed in the second element space 10024.

When the flexible display apparatus is folded, the hinge display part 10130 has a curved shape similar to a cylindrical shape. When the flexible display apparatus is stretched, the hinge display part 10130 has a substantially flat shape. When the flexible display apparatus is stretched, both ends of the display panel 10100 is extended by the cover 10 so that a tension is applied to the both ends of the display panel 10100. An end of the first display part 10110 and an end of the second display part 10120 are connected to an end of the first cover 11 and an end of the second cover 12, respectively. When the first and second covers 11 and 12 are stretched, the first and second covers 11 and 12 apply the tension to the ends of the first and second display parts 10110 and 10120. The tension applied to the ends of the first and second display parts 10110 and 10120 is transmitted to the first and second extended parts 10142 and 10144, the first and second display parts 10110 and 10120 and the hinge display part 10130 so that the display panel 10100 has a substantially flat shape.

According to the present example embodiment, the display panel 10100 includes the first and second extended parts 10142 and 10144, so that the display panel 10100 is securely combined with the first and second covers 11 and 12.

The above-mentioned example embodiments disclose an organic light emitting display apparatus. However, the present invention can also be applied to various display apparatuses such as a liquid crystal display apparatus, an electrophoretic display apparatus, a plasma display apparatus, and the like.

According to the examples of the present invention, the display part of the display panel is inclined with respect to the cover to compensate the thickness formed by the bending of the hinge display part. Thus, the element space is formed between the rear surface of the display part and the cover, thereby decreasing the thickness of the flexible display apparatus.

In addition, an externally provided impact that may be applied to the hinge cover or the hinge display part is dissipated to other portions of the flexible display apparatus, thereby preventing damage of the flexible display apparatus.

Also, the first and second display parts have the convex shapes facing each other to absorb the externally provided impact. Thus, the elements are protected from the externally provided impact to increase credibility.

Furthermore, the display panel includes the extended part to be securely combined with the cover.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flexible display apparatus comprising:
    a display panel configured to display an image, the display panel comprising:
        a first display part;
        a second display part; and
        a hinge display part interposed between the first and second display parts, the hinge display part configured to be foldable, wherein the hinge display part has a substantially circular shape when the flexible display apparatus is completely folded;
    a case configured to cover the display panel, the case comprising:
        a first cover configured to cover a first portion of the hinge display part and the first display part;
        a second cover configured to cover a second portion of the hinge display part and the second display part; and
        a third cover configured to cover a third portion of the hinge display part interposed between the first and second portions of the hinge display part; and
    a plurality of driving circuits disposed between a rear surface of the first display part and the case,
    wherein a distal end of the first display part is directly connected to the first cover, and a distal end of the second display part is directly connected to the second cover such that the display panel is stretched between its distal ends when the flexible display apparatus is completely unfolded,
    wherein a peripheral thickness of the case is greater than a hinge thickness of the case when the flexible display apparatus is completely unfolded, the hinge thickness being between the third cover and the hinge display part, the peripheral thickness being between an end of the case facing away from the hinge display part and a corresponding portion of the first or second display part, and
    wherein the first display part is co-planar with at least a portion of the first cover, and the second display part is co-planar with at least a portion of the second cover.

2. The flexible display apparatus of claim 1, wherein a distance between a first surface of the hinge display part and a second surface of the hinge display part, which faces the first surface of the hinge display part, is greater than or equal to a distance between the first display part and the second display part when the flexible display apparatus is completely folded.

3. The flexible display apparatus of claim 1, further comprising:
    a first driver connected to the display panel at the first display part, the first driver being accommodated in the first cover; and
    a second driver connected to the display panel at the second display part, the second driver being accommodated in the second cover.

4. The flexible display apparatus of claim 3, wherein the first driver is a scan driver, and the second driver is a data driver.

5. The flexible display apparatus of claim 3, wherein the first driver is electrically connected to the first display part by a first flexible printed circuit board, and
    wherein the second driver is electrically connected to the second display part by a second flexible printed circuit board.

* * * * *